United States Patent
Cho et al.

(10) Patent No.: US 7,660,126 B2
(45) Date of Patent: Feb. 9, 2010

(54) FLEXIBLE PRINTED CIRCUIT BOARD

(75) Inventors: Jin-woo Cho, Seongnam-si (KR);
Seong-woon Booh, Yongin-si (KR);
Dong-woo Lee, Seoul (KR); Ki-taek Kim, Yongin-si (KR); Yun-mi Seo, Yongin-si (KR); Dong-ok Kwak, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 191 days.

(21) Appl. No.: 11/107,979

(22) Filed: Apr. 18, 2005

(65) Prior Publication Data

US 2005/0237725 A1 Oct. 27, 2005

(30) Foreign Application Priority Data

Apr. 21, 2004 (KR) .................. 10-2004-0027344

(51) Int. Cl.
*H05K 1/00* (2006.01)
(52) U.S. Cl. .................. 361/749; 361/814; 174/254
(58) Field of Classification Search ......... 361/683–685, 361/814; 455/165; 439/65–72, 91; 174/254
See application file for complete search history.

(56) References Cited

U.S. PATENT DOCUMENTS

| | | | | |
|---|---|---|---|---|
| 4,845,315 A | * | 7/1989 | Stopper ..................... | 361/827 |
| 5,681,176 A | * | 10/1997 | Ibaraki et al. ............... | 439/165 |
| 6,439,905 B2 | * | 8/2002 | Andrews et al. ............ | 439/165 |
| 6,447,314 B1 | | 9/2002 | Kato et al. | |
| 7,097,479 B2 | * | 8/2006 | Lee ............................ | 439/165 |

FOREIGN PATENT DOCUMENTS

| | | |
|---|---|---|
| GB | 1 529 280 A | 10/1978 |
| JP | 60-083268 | 6/1985 |
| JP | 62-199057 A | 9/1987 |
| JP | 4-273495 A | 9/1992 |
| JP | 5-48218 A | 2/1993 |
| JP | 8-125299 A | 5/1996 |
| JP | 09-082439 | 3/1997 |
| JP | 10-144371 | 5/1998 |

OTHER PUBLICATIONS

Japanese Office Action dated Jun. 5, 2007 for JP 2005-123380.

* cited by examiner

*Primary Examiner*—Tuan T Dinh
(74) *Attorney, Agent, or Firm*—Sughrue Mion, PLLC

(57) ABSTRACT

A flexible printed circuit board is robust to a repeated twisting and consists of a minute circuit printed on a flexible insulated material sheet, and has the bent parts of the opposite edges symmetrical in structure. The bent parts are straightened out when twisting occurs. In the flexible printed circuit board, the opposite edges are longer in length than the middle part such that the tensile deformation at the opposite edges at the time of twisting does not occur or is minimized.

10 Claims, 7 Drawing Sheets

FLEXIBLE PRINTED CIRCUIT BOARD

CROSS-REFERENCE TO RELATED APPLICATIONS

This application claims the benefit of Korean Patent Application No. 2004-027344 filed on Apr. 21, 2004, in the Korean Intellectual Property Office, the disclosure of which is incorporated herein by reference in its entirety.

BACKGROUND OF THE INVENTION

1. Field of the Invention

The present invention relates to a flexible printed circuit board for an electronic, or electrical device such as a mobile phone or a lap top computer, for transmitting and receiving an electric signal between a main body and a second body such as a display which is pivotable to the main body.

2. Description of the Related Art

A flexible printed circuit board is a micro circuit printed on a flexible plastic material sheet, and is developed in response to the recent trend for small-sized, light-weight, and complicated electronic or electrical apparatuses. The flexible printed circuit board can be distributed by high density and three dimensional wire, is highly durable against repeated bending, has no wire distribution error, and can be easily assembled. Therefore, the flexible printed circuit board is widely used for various areas such as a camera, a computer, a peripheral device, a cellular phone, video and audio devices, a camcorder, a printer, a DVD device, a TFT LCD, satellite equipment, military equipment and medical equipment.

FIG. 1 is a view of an example of a cellular phone to which a general flexible printed circuit board is applied. As shown, in the cellular phone 1, a main body 2 and a folder 3 are foldably jointed by a hinge 4. A flexible printed circuit board 10 connects a main board 5 housed in the main body 2 and a sub board 6 housed in the folder 3 for operating an LCD to transmit and receive an electric signal.

Referring to FIG. 2, the flexible printed circuit board 10 comprises a first end part 11 connected with the main board 5 and a second end part 12 connected with the sub-board 6, and at least one horizontal part 13 exists in the hinge 4 between the first end part 11 and the second end part 12. The first end part 11 and the second end part 12 are approximately perpendicular with the horizontal part 13.

The folder 3 can be pivotably closed and opened to the cellular phone main body 2 by the flexible printed circuit board 10 such that an electric signal can be efficiently received and transmitted between the main board 5 and the sub board 6.

When the folder is pivotably closed and opened to the cellular phone main body 2 as described above, repeated bending and twisting simultaneously occurs in the flexible printed circuit board 10. In specific, the bending occurs at the perpendicular part of the flexible printed circuit board 10, and the twisting occurs at the horizontal part 13. Generally, the flexible printed circuit board 10 is robust to the bending but susceptible to the twisting.

When the twisting occurs at the horizontal part 13 as shown in FIG. 2, a stress is generated responsive to the tensile deformation as the edge is extended longer than the actual length. The tensile stress causes fatigue failure such that a minute circuit of the flexible printed circuit board 10 is disconnected and damaged.

To prevent the disconnection and damage of the minute circuit of the flexible printed circuit board 10 by the tensile stress, conventionally, the horizontal part 13 of the flexible printed circuit board 10 was extended longer than required in view of the twisting such that the tensile deformation may be minimized. If this method is used, however, the elongated horizontal part 13 of the flexible printed circuit board 10 sags such that the horizontal part 13 is frictionized with the inside of the hinge 4 and abraded.

SUMMARY OF THE INVENTION

The present invention addresses the above-mentioned problems occurring in the prior art, and an aspect of the present invention is to provide a flexible printed circuit board which does not require the length to be extended longer than necessary and results in higher reliability during twisting by reducing or preventing tensile deformation from occurring at the edge thereof.

In order to achieve the above aspects, there is provided a flexible printed circuit board consisting of a minute circuit printed on a flexible insulated material sheet, and the opposite edges are longer in length than the middle part.

Consistent with an exemplary embodiment of the present invention, the length of opposite edge parts are set in view of tensile-deformed length when the flexible printed circuit board is twisted. The length of opposite edge parts are variously set depending on the width and torsion angles of the flexible printed circuit board.

Consistent with another exemplary embodiment of the present invention, the flexible printed circuit board consists of a minute circuit printed on a flexible insulated material sheet, and has bent parts of the opposite edges, which are straightened out during twisting. The bent parts may be wave forms in a symmetrical structure.

The flexible printed circuit board consistent with an exemplary embodiment of the present invention has opposite edges being longer in length than the middle part such that tensile deformation at the opposite edges, during twisting, does not occur or is minimized. Therefore, the fatigue failure by the tensile stress can be prevented.

Further, consistent with the flexible printed circuit board of the present invention, the tensile deformation of the opposite edges can be minimized. For example, the portion housed in the hinge of cellular phone does not need to be extended more than necessary. As such, the friction between the flexible printed circuit board and the inside of hinge does not occur so that the flexible printed circuit board can be easily assembled.

BRIEF DESCRIPTION OF THE DRAWINGS

The above and other aspects, features and advantages of the present invention will be more apparent from the following detailed description taken with reference to the accompanying drawings, in which.

DETAILED DESCRIPTION OF THE EXEMPLARY EMBODIMENTS

Figure 1:
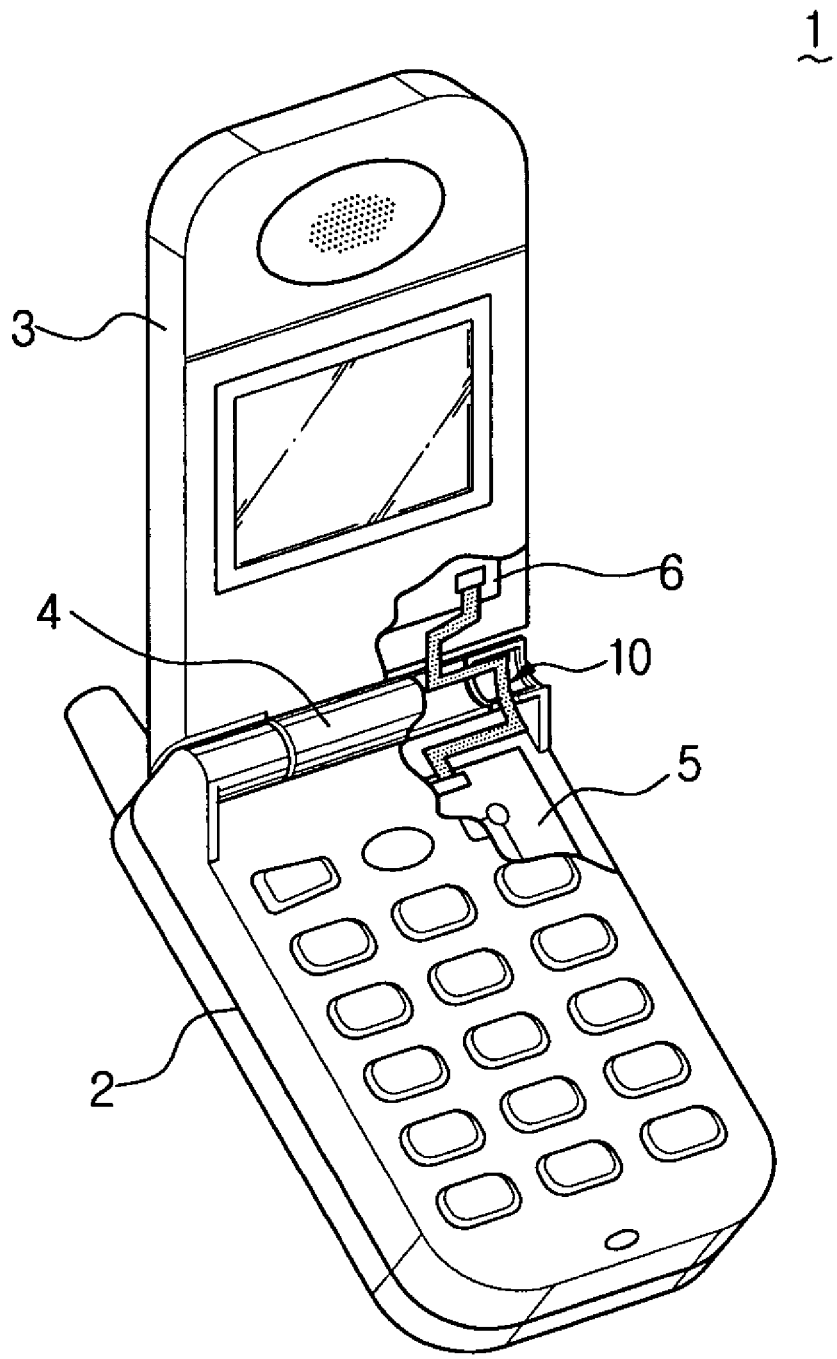
FIG. 1 is a view of a cellular phone to which a general flexible printed circuit board is applied.
Figure 2:
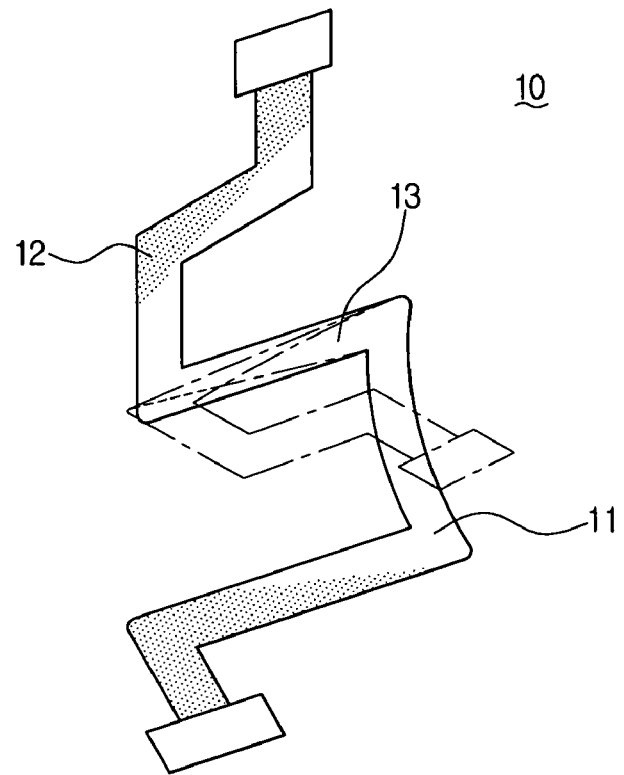
FIG. 2 is a view illustrating a twisting which occurs at the flexible printed circuit board when the cellular phone of FIG. 1 is used.
Figure 3:
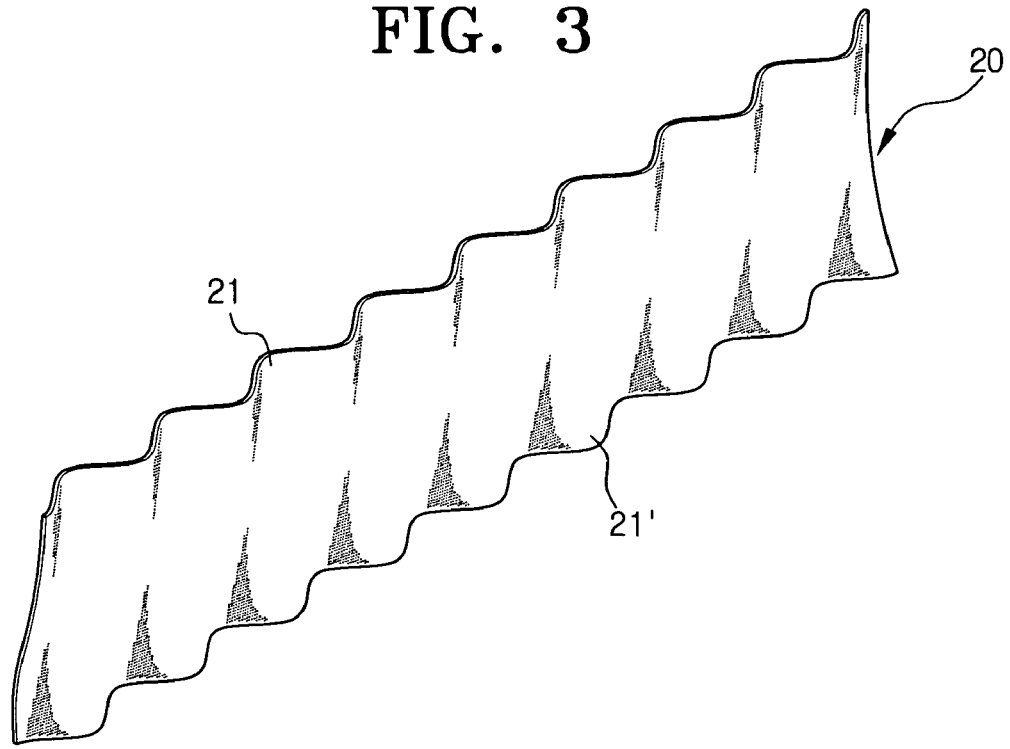
FIG. 3 is an enlarged view of a part of the flexible printed circuit board consistent with an exemplary embodiment of the present invention.
Figure 4A:
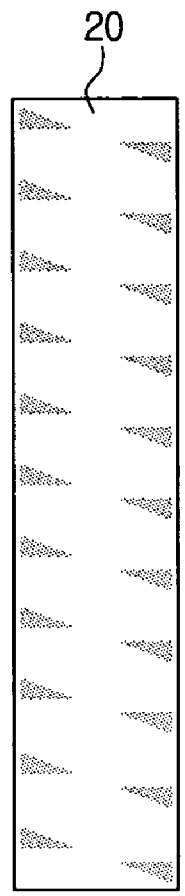
FIGS. 4A, 4B and 4C are a plan view, elevation view and side view, respectively, of FIG. 3.
Figure 4C:
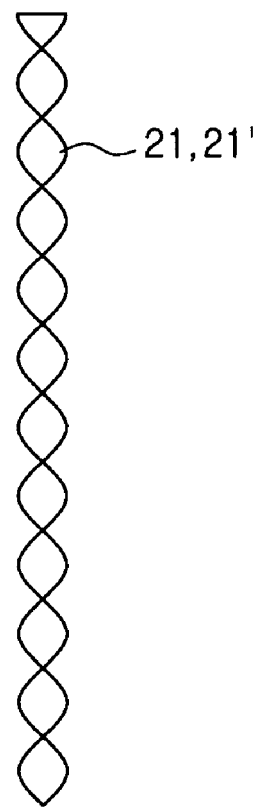
Figure 4B:
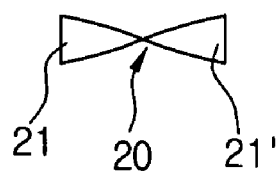

Exemplary embodiments of the present invention will be described in greater detail with reference to the accompanying drawings.

In the following description, same drawing reference numerals are used for the same elements even in different drawings. The matters defined in the description such as a detailed construction and elements are provided to assist in a comprehensive understanding of the invention. Thus, it is apparent that the present invention can be carried out without those defined matters. Also, well-known functions or constructions are not described in detail since they would obscure the invention in unnecessary detail.

As shown in FIG. 3, FIGS. 4A, 4B and 4C, the flexible printed circuit board 20 consistent with an exemplary embodiment of the present invention has bent parts 21, 21' configured at the opposite edge parts, the bent parts 21, 21' being straightened out during twisting. The bent parts 21, 21' at opposite edges may be symmetrical in structure and in wavelike forms.

One will understand that the bent parts 21, 21' are only an exemplary embodiment for setting the opposite edges to be longer in length than the middle part of the flexible printed circuit board 20, and therefore, this should not be considered as limiting. Various structures are possible, if the opposite edge parts can be longer in length than the middle part of the flexible printed circuit board 20.

The bent parts 21, 21' are straightened out during the twisting, preventing the opposite edges of the flexible printed circuit board 20 from tensile deformation. As such, the bent parts 21, 21' are suitable for the purpose of the present invention which does not require the length of the edges to be extended longer than necessary and minimizes the tensile deformation during twisting.

As described above, by bending the opposite edge parts, longer than middle part, of the flexible printed circuit board 20, the opposite edges are not forcibly extended but straightened out such that no tensile deformation occurs on the opposite edge of the flexible printed circuit board 20 except for a little bending deformation. As aforementioned, the flexible printed circuit board is highly reliable to bending, and therefore, if the board can be also robust to twisting, the lifetime may be prolonged much longer.

The length of opposite edge parts may be set in view of a tensile-deformed length when the flexible printed circuit board 20 is twisted. However, since the length varies according to the width and torsion angle of the flexible printed circuit board 20, the length may be applied by calculating from experiments and/or mathematical formulas in view of the width and torsion angle.

Although it is not described in detail, the flexible printed circuit board 20 consists of a minute circuit printed on a flexible insulated material sheet such as plastic, and the minute circuit is for transmitting an electrical signal. However, in the flexible printed circuit board 20 consistent with an exemplary embodiment of the present invention, the opposite edge parts are set longer than the middle part and bent parts 21, 21' are configured at the opposite edge parts for preventing tensile deformation during twisting.

The bent parts 21, 21' may be configured simultaneously with a hot press by forming shapes of prominences and depressions corresponding to the bent parts 21, 21' in a mould during the hot press, which is one of the production processes of the flexible printed circuit board 20. That is, the bent parts are easily configured by changing the structure of a mould for a hot press, without adding a separate process, in the manufacturing line of the conventional flexible printed circuit board.

Figure 5:
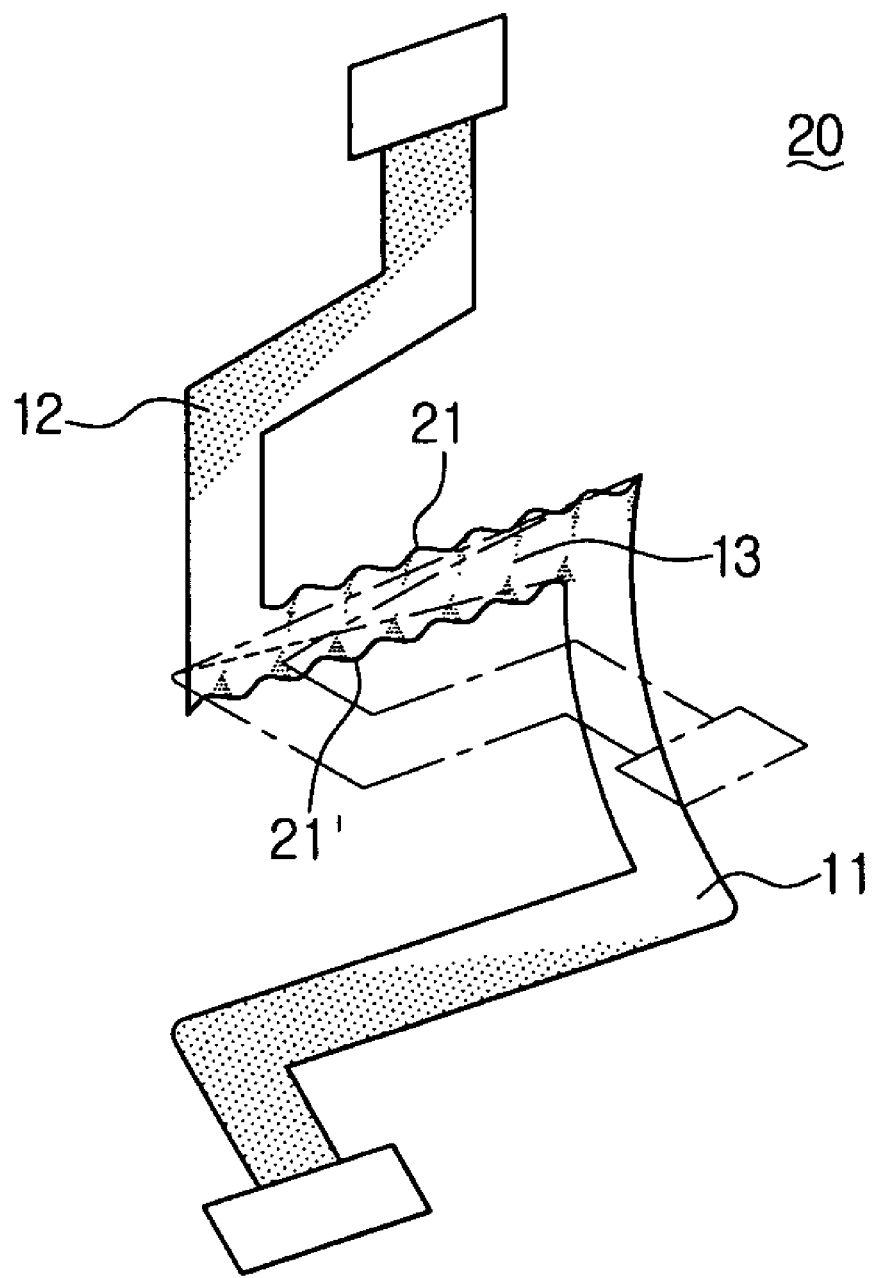
FIG. 5 is a view illustrating a buffering operation against a twisting in the flexible printed circuit board for a cellular phone consistent with an exemplary embodiment of the present invention.

FIG. 5 is a view of a flexible printed circuit board 20 for a cellular phone consistent with an exemplary embodiment of the present invention. Referring to the figures, the flexible printed circuit board for a cellular phone consistent with an exemplary embodiment of the present invention will be explained as below.

Referring to FIG. 1, in the cellular phone 1, a main body 2 and a folder 3 are foldably jointed by a hinge 4. A main board 5 is housed in the main body 2, and a sub board 6 for operating an LCD is housed in the folder 3.

Referring to FIG. 5, the flexible printed circuit board 20 consistent with an exemplary embodiment of the present invention comprises a first end part 11 connected with the main board 5 and a second end part 12 connected with the sub board 6. At least one horizontal part 13 housed in the hinge 4 is formed between the first end part 11 and the second end part 12. The first end part 11 and the second end part 12 are substantially perpendicular with respect to the horizontal part 13.

The horizontal part 13 has bent parts 21, 21' at the opposite edges, and the bent parts 21, 21' are straightened out when twisting by a pivotal opening and closing of the folder 3 which occurs at the opposite edges. The bent parts 21, 21' have the structure and are operated as same as the aforementioned bent parts, and therefore, the detailed description thereof will be omitted for conciseness.

Meanwhile, since a folder type cellular phone is used in the exemplary embodiments, the bent parts 21 and 21' are explained as being configured at the horizontal part 13 of the flexible printed circuit board 20. However, if the flexible printed circuit board 20 is applied to a cellular phone having a camera such that the folder can be rotated to other directions including an open and close direction with respect to the main body, it is natural that the flexible printed circuit board 20 may also have the aforementioned bent parts at the perpendicular part to prevent repeated tensile deformation.

Figure 6A:
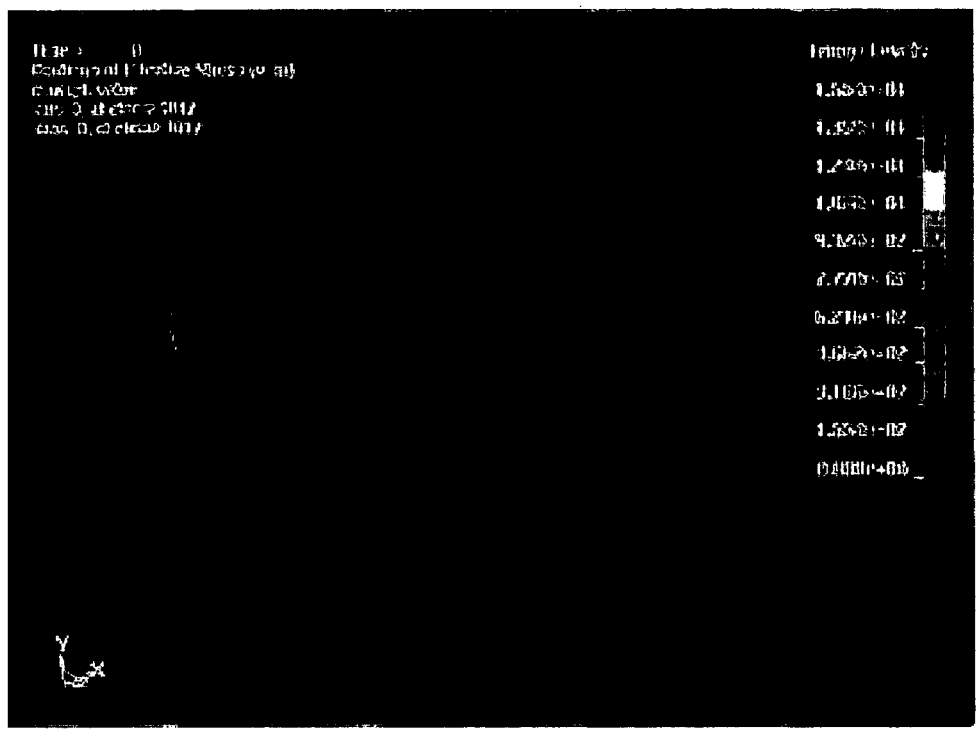
FIGS. 6A, 6B and 6C are views for comparison of the result and effect of simulation of a flexible printed circuit board consistent with an exemplary embodiment of the present invention and a flexible printed circuit board according to a conventional art.
Figure 6B:
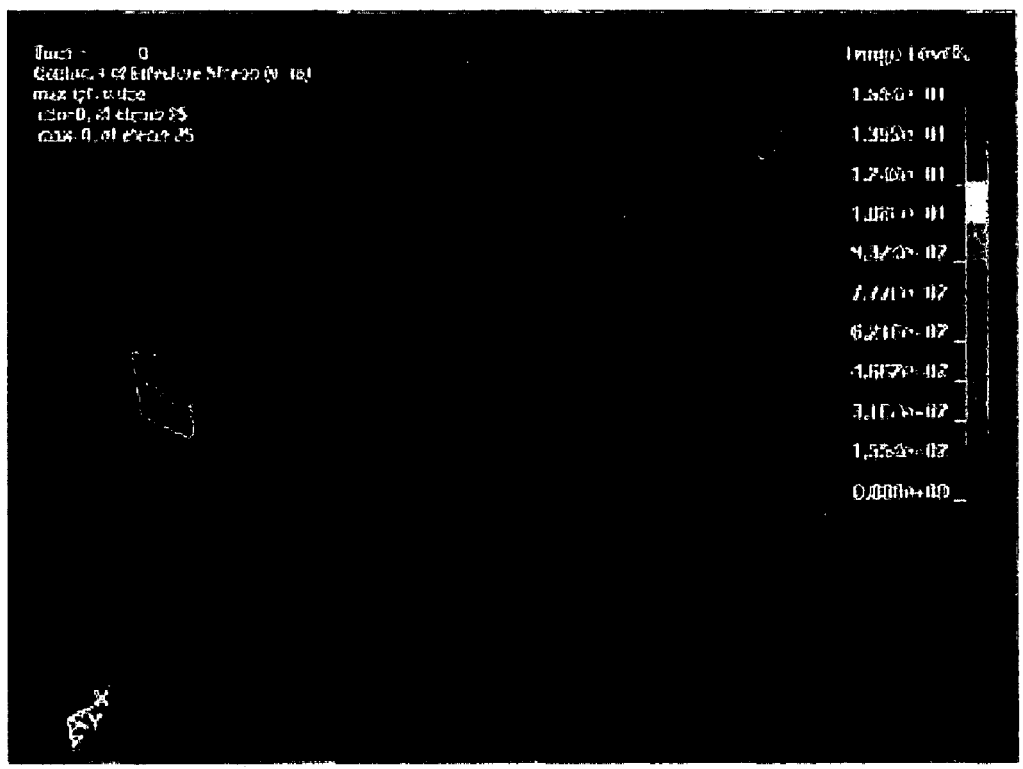

FIG. 6A is a view of a simulation result of a conventional flexible printed circuit board, and FIG. 6B is a view of simulation result of a flexible printed circuit board consistent with an exemplary embodiment of the present invention. For both simulations, analysis software called as LSDyna is used, and principle stress generated at the edge part is measured when one side is fixed and the other side is revolved by 180 degrees. The value of principle stress according to a conventional art is 155 Mpa, whereas the value of principle stress consistent with an exemplary embodiment of the present invention is 90 Mpa.

Figure 6C:
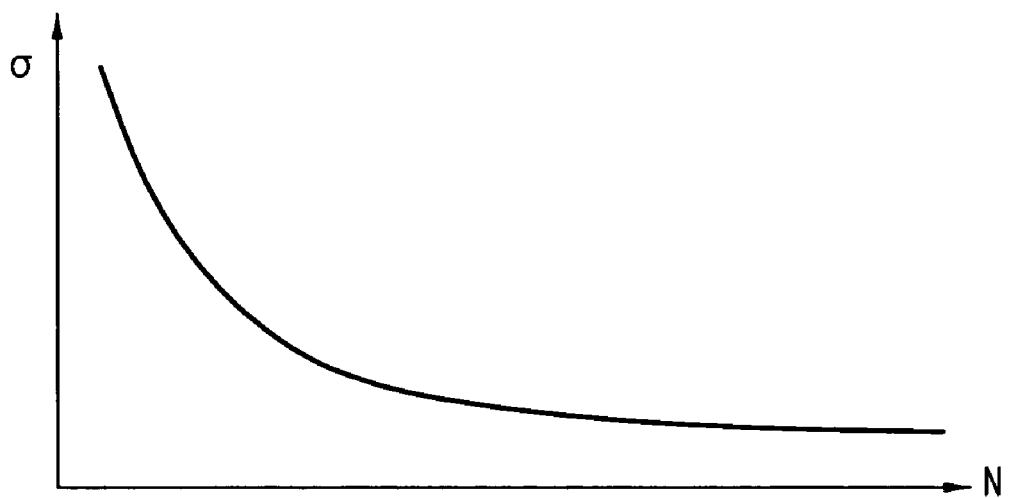

FIG. 6C is a representative graph of correlations between the principle stress σ and the repeated torsion number N. Referring to the graph, as the principle stress σ of vertical axis is higher, the repeated torsion number N of horizontal axis is remarkably lower, and as the principle stress σ is lower, the repeated torsion number N is remarkably higher. Accordingly, the present invention having the principle stress of 90 Mpa can increase the number N of repeated twisting more than the conventional art having the principle stress of 155 Mpa. In the case of a cellular phone, the repeated twisting number N means the number of opening and closing of the folder with respect to the cellular phone main body.

A flexible printed circuit board consistent with an exemplary embodiment of the present invention can decrease stress of the edge parts such that the lifetime of the flexible printed circuit board may be longer, and an electrical and electronic apparatus using the flexible printed circuit board may have increased quality and reliability.

Also, in accordance with the flexible printed circuit board consistent with an exemplary embodiment of the present invention, the stress by torsion of the opposite edge parts can be reduced. For example, the flexible printed circuit board in the hinge of cellular phone does not need be extended more than necessary. As a result, quality degradation such as abrasion by friction of the flexible printed circuit board is prevented.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A flexible printed circuit board for a portable device having a first member and a second member capable of moving with respect to the first member, the flexible printed circuit board operable to connect the first member and the second member for receiving and transmitting an electrical signal therebetween and comprising:
   a flexible insulated material sheet and a minute circuit printed on the flexible insulated material sheet, and
   wherein a horizontal portion of the flexible printed circuit board is formed so that each of opposite lengthwise edge parts of the horizontal portion positioned along an entire lengthwise length of the horizontal portion at opposite lengthwise edges of the horizontal portion has a greater length than a lengthwise dimension between the opposite lengthwise edge parts;
   wherein the length of the opposite edge parts is set in view of a tensile-deformed length when the flexible printed circuit board is twisted; and
   wherein the length of the opposite edge parts is set depending on the width and torsion angles of the flexible printed circuit board.

2. The flexible printed circuit board according to claim 1, wherein the opposite lengthwise edge parts are along an entire length of the horizontal portion.

3. A flexible printed circuit board for a portable device having a first member and a second member capable of moving with respect to the first member, the flexible printed circuit board operable to connect the first member and the second member for receiving and transmitting an electrical signal therebetween, and comprising:
   a flexible insulated material sheet and a minute circuit printed on the flexible insulated material sheet; and
   bent parts configured along an entire lengthwise length of a horizontal portion at opposite lengthwise edges of the horizontal portion of the flexible printed circuit board,
   wherein the bent parts are straightened out along the length of the horizontal portion of the flexible printed circuit board during twisting; and
   wherein the bent parts comprise alternating prominences and depressions along each opposite edge part.

4. The flexible printed circuit board according to claim 3, wherein the bent parts are in wavelike forms.

5. The flexible printed circuit board according to claim 3, wherein the bent parts are configured at each opposite edge part of a horizontal middle portion of the flexible printed circuit board.

6. The flexible printed circuit board according to claim 3, wherein the bent parts are formed alternating along each opposite edge part of a horizontal middle portion of the flexible printed circuit board.

7. The flexible printed circuit board according to claim 4, wherein the bent parts have symmetrical structures.

8. A flexible printed circuit board for a cellular phone having a main body housing a main board; and a folder jointed with the main body by a hinge to foldably open and close and housing a sub board for operating an LCD, the flexible printed circuit board operable to connect the main board and the sub board for receiving and transmitting an electric signal therebetween, comprising:
   a flexible insulated material sheet and a minute circuit printed on the flexible insulated material sheet to transmit the electric signal;
   a first end part connected with the main board;
   a second end part connected with the sub board; and
   a horizontal part configured between the first end part and the second end part, and is housed in the hinge;
   wherein the horizontal part has bent parts configured along an entire lengthwise length of the horizontal part at opposite lengthwise edges of the horizontal part, and the bent parts along the length of the horizontal part are straightened out when twisting occurs by pivotal closing and opening of the folder;
   wherein the horizontal part of the flexible printed circuit board is formed so that each of opposite lengthwise edge parts of the horizontal part at which the bent parts are configured has a greater length than a lengthwise dimension between the opposite lengthwise edge parts; and
   wherein when the bent parts are straightened out, the opposite edge parts are set longer in length than of a middle part.

9. The flexible printed circuit board for a cellular phone according to claim 8, wherein the length of the opposite edge parts is set in view of the length varied by tensile deformation during twisting.

10. The flexible printed circuit board for a cellular phone according to claim 8, wherein the bent parts of the opposite edge parts have symmetrical structures and wavelike forms.

* * * * *